United States Patent
Pulakka et al.

(10) Patent No.: US 11,808,814 B2
(45) Date of Patent: Nov. 7, 2023

(54) DRIVE FOR AN ELECTRIC APPLICATION AND PROCESSES FOR MAINTAINING AND FINE-TUNING THE DRIVE

(71) Applicant: Vacon Oy, Vaasa (FI)

(72) Inventors: Ari Pulakka, Nordborg (DK); Jetro Itäniemi, Laihia (FI); Janne Pakkala, Merikaarto (FI); Jussi Pouttu, Vaasa (FI); Nicklas Södö, Vaasa (FI)

(73) Assignee: Vacon OY, Vaasa (FI)

( * ) Notice: Subject to any disclaimer, the term of this patent is extended or adjusted under 35 U.S.C. 154(b) by 89 days.

(21) Appl. No.: 17/330,654

(22) Filed: May 26, 2021

(65) Prior Publication Data

US 2021/0373080 A1     Dec. 2, 2021

(30) Foreign Application Priority Data

May 27, 2020 (DE) .......................... 102020114222.6

(51) Int. Cl.
| | |
|---|---|
| *G01M 15/05* | (2006.01) |
| *H02P 29/024* | (2016.01) |
| *G01H 1/00* | (2006.01) |
| *G01R 31/34* | (2020.01) |

(52) U.S. Cl.
CPC ........... *G01R 31/343* (2013.01); *G01H 1/003* (2013.01); *G01M 15/05* (2013.01); *H02P 29/024* (2013.01)

(58) Field of Classification Search
CPC ..... G01R 31/343; G01H 1/003; G01M 15/05; H02P 29/024
See application file for complete search history.

(56) References Cited

U.S. PATENT DOCUMENTS

| | | | |
|---|---|---|---|
| 5,230,023 A * | 7/1993 | Nakano | G10L 15/22 704/E15.04 |
| 5,728,938 A * | 3/1998 | Choi | G01M 13/028 73/593 |
| 2006/0142972 A1 | 6/2006 | Cancilla et al. | |
| 2008/0164091 A1 * | 7/2008 | Kerber | F03D 7/0296 181/296 |
| 2018/0129231 A1 * | 5/2018 | Meeuwsen | G05D 19/02 |
| 2019/0186616 A1 * | 6/2019 | Bassis | F16H 57/028 |

FOREIGN PATENT DOCUMENTS

| | | | | |
|---|---|---|---|---|
| DE | 19924955 A1 * | 12/1999 | | G01H 1/00 |
| DE | 10 2011 006 125 A1 | 9/2012 | | |
| DE | 10 2015 217 110 A1 | 3/2017 | | |
| EP | 0 676 070 B1 | 4/1997 | | |
| WO | WO-2015096908 A1 * | 7/2015 | | G01H 1/00 |

\* cited by examiner

*Primary Examiner* — Natalie Huls
*Assistant Examiner* — Sharad Timilsina
(74) *Attorney, Agent, or Firm* — McCormick, Paulding & Huber PLLC (57) ABSTRACT

The present invention relates to a drive for an electric application such as an electric motor, said drive including at least one microphone for registering noise signals occurring at the drive, wherein the microphone is connectable to a computing device for analysing the registered noise signals. The registered noise signals may be used for a maintenance process of the drive and/or a fine-tuning process of a drive control method of the drive. The present invention also relates to a maintenance process, in particular a predictive maintenance process for a corresponding drive. Furthermore, the present invention relates to a process for fine tuning a drive control method of a corresponding drive.

19 Claims, 3 Drawing Sheets

DRIVE FOR AN ELECTRIC APPLICATION AND PROCESSES FOR MAINTAINING AND FINE-TUNING THE DRIVE

CROSS-REFERENCE TO RELATED APPLICATION

This application claims foreign priority benefits under 35 U.S.C. § 119 to German Patent Application No. 102020114222.6 filed on May 27, 2020, the content of which is hereby incorporated by reference in its entirety.

TECHNICAL FIELD

The present invention relates to a drive for an electric application such as an electric motor, said drive comprising at least one microphone for registering noise signals occurring at the drive, wherein the microphone is connectable to a computing device for analysing the registered noise signals by comparing the registered noise signals to previously stored noise signals. The registered noise signals may be used for a maintenance process of the drive and/or a fine-tuning process of a drive control method of the drive. The present invention also relates to a maintenance process, in particular a predictive maintenance process for a corresponding drive. Furthermore, the present invention relates to a process for fine-tuning a drive control method of a corresponding drive.

BACKGROUND

Drives are used for controlling e.g. the movement of electric applications such as electric motors. Said drives may be adapted to transform an electric power supply such that a desired behaviour such as desired rotational speed, a desired output torque or a desired position of an electric motor or the like is achieved. In order to achieve this goal, drives may transform e.g. an alternating supply current into a current, which results in a desired motor behaviour.

Drives may comprise numerous components and fulfil various functions, which alone or in combination with each other allow for the desired control and/or power supply of the electric application, such as e.g. the above-mentioned electric motor. As with any equipment, drives and their components may require maintenance work, tuning and/or surveillance for keeping the drives running as well as for keeping the electric applications controlled by the drives. Maintenance work, tuning and/or surveillance of the drives may be complicated by the drives being not easily accessible, by maintenance work resulting in undesired downtimes of the electric applications and/or by surveillance means representing considerable additional hardware and/or software applications.

SUMMARY

One objective of the present invention is therefore to better monitor drives, such that maintenance work and tuning of the drives can be facilitated and/or reduced or can be pre-planned better with accordingly reduced down times of the drives and of the electric applications driven by the drives. This objective is achieved by a drive according to claim 1 as well as by the maintenance and tuning processes according to claims 8 and 9.

According to the invention, a drive for an electric application such as an electric motor is provided, said drive comprising at least one microphone and/or piezo sensor and/or wave sensor for registering noise signals occurring at the drive, wherein the microphone is connectable to a computing device for analysing the registered noise signals by comparing the registered noise signals to previously stored noise signals. The registered noise signals may be used for purposes such as e.g. processes like a maintenance process of the drive and/or a fine-tuning process of a drive control method of the drive. The registered noise signals may also be used for further purposes such as production testing and/or trouble shooting of the drive.

The microphone may be chosen to register acoustic and/or vibrational noise occurring at the drive or near the drive. The term microphone may be understood in a broad sense and may comprise any acoustic noise pick up device. The noise may result from e.g. vibrations of the drive's components. Alternatively or additionally, the noise may result from vibrations, which are generated by acoustic sources, which are not components of the drive itself. The terms "noise signals" and "signals" presently used may clearly also refer to a single noise signal or a single general signal of indefinite length or size.

The registered vibrations may correspond to normal functioning of the drive but may also be indicative of some malfunctioning of the drive, its individual components or even of components not directly associated with the drive but merely connected to the drive in some structural, electric or other way. For example, a liquid cooling circuit of the drive may produce a certain kind of noise when operating under normal conditions. However, this noise may change in case of a malfunction of the liquid cooling circuit. This change of noise may be audible to the microphone. The microphone may therefore be used to detect malfunctions of the drive or may detect indicators of future malfunctions of the drive or its surroundings.

In order to identify the correct state of the drive or the correct phenomenon occurring at the drive such as e.g. a malfunctioning liquid cooling circuit or another damaged component, reference noise signals may be stored at the computing device. The stored reference noise signals may correspond to malfunctions as the ones described above or to other phenomena of relevance to the drive, which will be described below in more detail. The computing device may therefore evaluate the noise signals registered by the microphone and compare those registered signals to the stored reference signals. A phenomenon corresponding to some stored noise signal may be therefore be deduced from the comparison of the registered noise signal of the drive or its surrounding to a stored reference noise signal. The stored reference noise signal clearly has to be attributed correctly to some relevant phenomenon for the computing device to correctly correlate a registered noise signal to a relevant phenomenon.

As the registered noise signals may indicate certain phenomena occurring at the drive, said noise signals may therefore be used in connection with various processes associated with the drive. For example, the noise signals may be used as input data for a maintenance process for the drive or for devices near the drive. Additionally or alternatively, the noise signals may be used as input data for a fine-tuning process of a drive control method of the drive. The noise signals may be signals, which originate at the drive or at some noise source other than the drive. Therefore, the present invention may also be used in connection with processes, which occur at other devices than the drive itself.

The computing device may comprise any components and/or software required for processing and/or analysing the registered noise signals, in particular a CPU, storage devices, power supplies and communication means for connecting the computing device to the microphone and/or other computing devices. Depending on the actual electric application connected to the drive, different noise signals and different corresponding phenomena may be defined as relevant and stored in the computing device for comparison with the registered noise signals.

In a preferred embodiment of the invention, the drive comprises a front-end or input rectifier, an inverter drive, a controller, a frequency converter, an inverter, a converter and/or a front end drive. The drive may comprise a combination of any of the cited and/or still other applications. The drive may be arranged in a housing, representing an enclosed component and comprising various applications in some embodiments. The drive may comprise a power supply connection for providing electric power to the driven and/or the electric application, fastening portions for fastening the drive in a desired positon and/or input/output means for inputting data into and outputting information from the electric application.

In another preferred embodiment of the invention, the microphone is an acoustic or a vibroacoustic microphone and/or a piezo sensor and/or a wave sensor. The microphone may be integrated on a circuit board of the drive or of the computing device of the drive. The integration of the microphone on a circuit board represents a cost-effective way of providing a microphone at the drive. Accordingly, the microphone may be provided inside of a housing of the drive. Consequently, as the drive may be contained in a housing, the microphone may be provided inside said housing as well. In order to facilitate the functioning of the microphone, the housing of the drive may comprise openings. Noises originating at the outside of the drive may be better registered by the microphone through the openings.

Alternatively or additionally, a microphone may be provided, which may be positioned outside of the housing of the drive. A corresponding embodiment with an external microphone may facilitate the retrofitting of existing drives such that a drive as known form the art may be easily converted into a drive in accordance with the present invention. However, even an internal microphone may also be used for retrofitting an existing drive. In this case, a drive without any microphone may be upgraded to correspond to the present invention by replacing components of an existing computing device of the drive by components, which comprise one or more integrated microphones. Said integrated microphones may be provided on e.g. a printed circuit of the computing device.

In another preferred embodiment of the invention, the computing device is connected to the one microphone. The computing device may form an integral part of the drive. The connection between the computing device and the microphone may be not only optional but permanent. The computing device may be provided within the same housing as the remainder of the drive's components. Alternatively or additionally, a computing device or part of a computing device may be provided separate from the remainder of the drive's components, in particular outside of the drive's housing. This arrangement may facilitate the retrofitting of an existing drive and it may also allow the use of some centralized computing device in connection with a drive. The drive may comprise more than one computing device. The drive may be spaced apart from at least one of its computing devices.

In another preferred embodiment of the invention, the computing device is connected to a maintenance computer. The maintenance computer may be situated in a separate location from the drive, in particular at a different place than the drive such as e.g. the site of the manufacturer or a service provider of the drive. The drive, or more precisely, the computing device the drive is connected to, may be connected to the maintenance computer via internet or some other form of in particular long-distance connection. The maintenance computer may be connected to a plurality of drives or computing devices of drives. The maintenance computer may comprise large amounts of data, representative of noise signals occurring at various kinds of drives. The data stored at the maintenance computer may be updated regularly to include all possible kinds of noises signals occurring at the drives. The maintenance computer may therefore function as a centralized maintenance tool, which permits the centralized and/or remote maintenance or monitoring of a plurality of drives. The use of the maintenance computer makes it possible to maintain or monitor the drives without necessarily employing an engineer at the site of the individual drive, thereby simplifying the maintenance or monitoring task.

In another preferred embodiment of the invention, the computing device and/or the drive is controllable by verbal input of an operator into the microphone. The computing device may be adapted to convert words spoken by e.g. an operator into the microphone into commands controlling the operation of the drive and/or the computing device. This feature may be employed to simplify the architecture and the use of the drive. Additionally or alternatively, the microphone may be used to establish an acoustic connection between an operator present at the drive and some maintenance specialist present at the site of the previously described maintenance computer or some other site. A loudspeaker and/or display can be provided at the drive, which may facilitate communication between an operator at the site of the drive and the maintenance specialist mentioned above.

In another preferred embodiment of the invention, more than one microphone is provided. Clearly, if more than one microphone is used with the invention, the same or different kinds of microphones may be used. Two or more microphones may be used to provide backup in case one of the microphones malfunctions. Additionally, using a plurality of microphones makes it possible to locate noise sources through triangulation. For example, four microphones might be used in the drive, which are not aligned in one plane. In this case, the four microphones might be provided e.g. in or close to four different corners of a cuboid drive housing. Should some acoustic phenomena occur inside or outside of the drive housing, the corresponding noise would reach the four different microphones at times, which depend on the distance between the noise source and the individual microphones. The position of the noise source could then be determined from the precise points in time, at which the noise signal reaches the individual microphones.

The present invention is also directed at a maintenance process, in particular a predictive maintenance process according to claim 8. The maintenance process pertains to a drive according to any of claims 1 to 7, and comprises the steps of a. registering noise signals occurring at the drive;
b. comparing the registered noise signals to previously stored noise signals; and
c. outputting output signals as a function of the comparison of the registered noise signals to the previously stored noise signals.

The noise signals occurring at the drive may be registered by the at least one microphone. The noises may occur anywhere inside and/or outside the drive. The registering of the noise signals may comprise the storing of the registered noise signals to some memory device of the drive.

Comparing the registered noise signals to previously stored noise signals may be performed by means of the computing device. The computing device may comprise software for comparing noise signals to each other. As a result of the comparison performed by the software, pairs of similar noise signals may be identified, wherein one noise signal of the pair of noise signals is a noise signal registered by the microphone and the other noise signal of the pair is a previously stored noise signal, which is correlated to the occurrence of some phenomenon at or near the drive such as e.g. a malfunction or an acoustic phenomenon which usually precedes a malfunction. By means of this comparison, a registered noise signal may be correlated to the occurrence of a phenomenon at the drive, such as e.g. said malfunction.

If a registered noise signal is correlated to some phenomenon, the drive may be configured to output a signal. The output signal may vary as a function of the comparison of the registered noise signals to the previously stored noise signals. The output signal may be displayed on some display device of the drive and/or may be transmitted to some other device, for example to a maintenance tool or a maintenance computer of an operator or a maintenance specialist. The output signal may comprise information on the registered noise signal and/or on the phenomenon correlated to said registered noise signal. The output signal may comprise information pertaining to the registered noise signal such as the time of its occurrence, the location of its noise source and/or a recording or an audio file of the actual registered noise signal. If the registered noise signal is found to be indicative of a prospective malfunction, then the registered noise signal may trigger some maintenance activities such that e.g. predictive maintenance can be conducted by means of the presently disclosed device and process.

The present invention is also directed at a fine-tuning process according to claim 9. The fine-tuning process pertains to a drive control method of a drive according to any of claims 1 to 7, and comprises the steps of
   a. registering noise signals occurring at the drive;
   b. registering output and/or input characteristics of the electric application and/or the drive;
   c. comparing the registered noise signals to previously stored noise signals;
   d. comparing the registered output and/or input characteristics to previously stored output and/or input characteristics; and
   e. varying the input characteristics, as a function of the comparison of the registered noise signals to the previously stored noise signals and/or as a function of the comparison of the registered output and/or input characteristics to previously stored output and/or input characteristics, such that the noise signals occurring at the drive are minimized and/or that the output characteristics of the electric application are maximized.

As in the previously described maintenance process, the fine-tuning process comprises the registering of noise signals occurring at the drive. The noise signals occurring at the drive may be registered by the at least one microphone. The noises may occur anywhere inside and/or outside the drive. The registering of the noise signals may comprise the storing of the registered noise signals to some memory device of the drive.

The fine-tuning process may comprise registering output and/or input characteristics of the electric application and/or the drive, which are indicative of the performance of the electric application and/or the drive. The term "characteristics" may presently refer to any physical variables such as currents, voltages, impedances etc. of the associated devices or components. In case an electric motor is the electric application driven by the drive, its speed or the noise generated by the electric motor may be registered. Additionally, the noise signals occurring directly at the drive may be registered. The fine-tuning process may then vary the input characteristics of the electric application and/or of the drive, such that the drive control method is optimized in view of the registered signals and characteristics.

In a preferred embodiment of the fine-tuning process, the fine-tuning process comprises a sweep of a motor load and/or a sweep of a motor frequency. The motor frequency may clearly pertain to the rotational speed of the motor. The results of the sweeps may be stored in a memory device and at a plurality of points and/or time moments. The stored results may be compared to each other and/or to current sweeping results for future use and may be part of a conditional monitoring of the drive. This is particularly useful as the drive may be operate at various different frequencies and loads, at which the performances of the drive may vary vastly. Monitoring the current and previous results of the sweeps makes it possible to more precisely determine the state of the drive and to correlate the state of the drive to acoustic phenomena.

Both, the maintenance process and the fine-tuning process may be inherently linked to the drive described in the present description and in the corresponding apparatus claims. The process steps presently described with regard to the two processes may be fully or partially repeated and/or may be conducted in any other logically possible orders other than the ones presently described. Further details and advantages of the invention are described with reference to the embodiments shown in the following figures.

DETAILED DESCRIPTION

Figure 1:
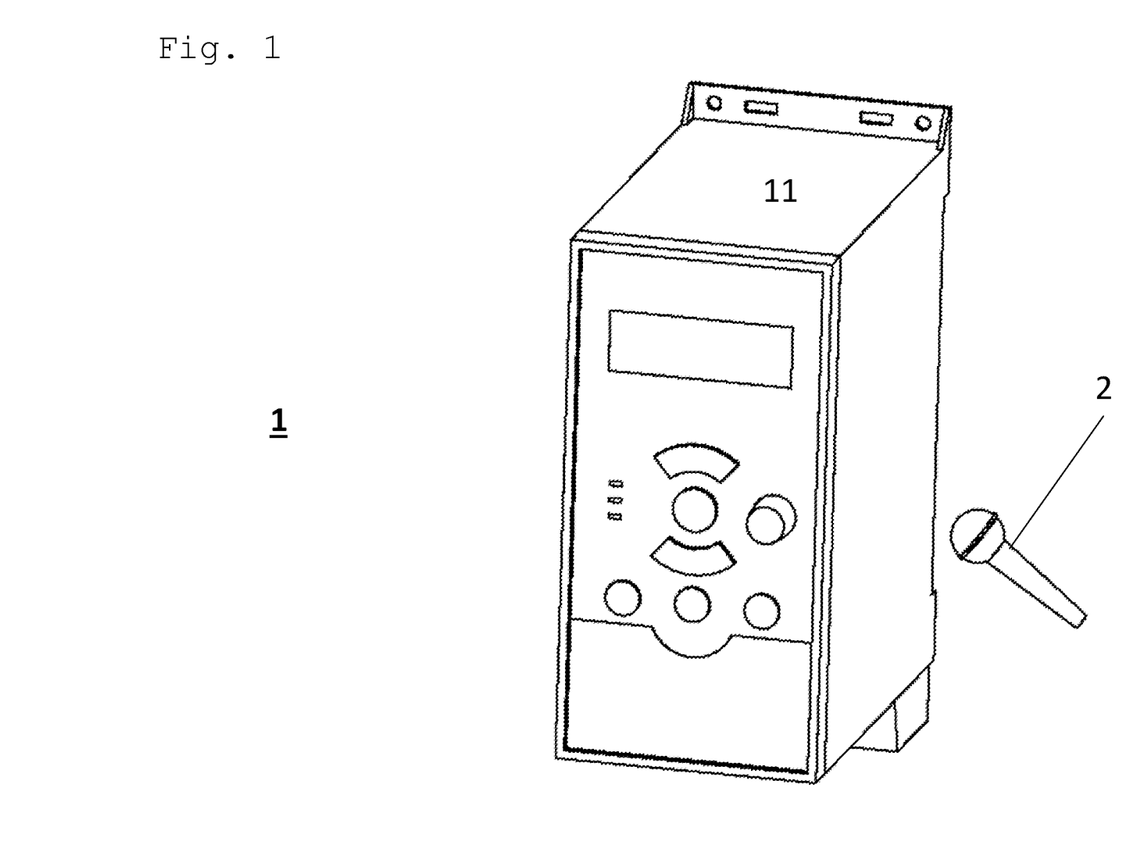
FIG. 1: drive 1 according to the invention

FIG. 1 shows a drive 1 for driving an electric application, such as an electric motor. The electric application is not shown in FIG. 1, however, the drive 1 might usually be situated close to the electric application. The drive 1 comprises at least one microphone 2, which is symbolically shown in FIG. 1. Although a single microphone 2 is shown on the outside of the drive 1, an internal microphone 2 and/or a plurality of microphones 2 may be used alternatively or additionally.

The microphone 2 is designed to register noise signals occurring at or near the drive 1. The registered noise signals may correspond to e.g. mechanical and/or electrical noise sources present at or near the drive 1. The noise signals and the corresponding noise sources will be described below in more detail. The microphone 2 may be selected to be particularly sensitive to the kinds of noise signals typically occurring at the drive and/or may be less sensitive to other kinds of noise signals.

The noise signals registered by the microphone 2 may be transmitted to a computing device for analysing said noise signals, as will be described later in more detail. The computing device may be contained in the same housing 11 as other components of the drive 1. Additionally or alternatively, a computing device may be provided outside the housing 11 of the drive 1 and/or separated and/or spaced apart from the housing 11.

The drive 1 may comprise various sub-components, which may or may not be provided inside the same housing 11. In particular, the drive may comprise a front-end or input rectifier, an inverter drive, a controller, a frequency converter, an inverter, a converter such as a voltage converter and/or a front end drive, in particular an active front end drive. The sub-components of the drive 1 may be selected to suit the actual electric application driven by the drive 1.

The drive 1 comprises at least one microphone 2, which may be an acoustic or a vibroacoustic microphone 2. In cases in which a plurality of microphones 2 is used, different or identical microphones 2 may be employed. Although a symbolic external microphone 2 is shown in FIG. 1, the microphone 2 may be an integrated microphone 2, which may be positioned inside the housing 11 of the drive 1. In particular, the microphone 2 may be provided on a circuit board of the drive 1, positioned e.g. inside the housing 11 of the drive. If more than one microphone 2 is provided on a circuit board, the different microphones 2 may be spaced apart on the circuit board such that the distance between the microphones 2 is large with respect to the dimensions of the circuit board. For example, the microphones 2 may be positioned at or near corners of a rectangular circuit board.

The computing device of the drive 1 may be connected permanently to the microphone 2. The term computing device may be understood in a broad sense, comprising any electronic and mechanical components necessary to perform computing operations with respect to the noise signals registered by the microphone 2. The computing device may be provided inside or outside the housing 11. The computing device may also comprise components for supplying power to the microphone 2 and/or the drive 1.

The computing device of the drive 1 may be connected to a maintenance computer not shown in FIG. 1. The maintenance computer may be provided away from the drive 1. It may be connected via some long-distance connection to the computing device, for example over the internet. One such maintenance computer may be connected to a plurality of computing devices of a plurality of drives 1. The maintenance computer may be provided at a different site than the drive 1 and may be accessible to some maintenance specialist. In particular, the maintenance computer may be provided at the site of the manufacturer of the drive 1 or of a service company servicing the drive 1, whereas the drive 1 may be present at the site of a company using the drive 1 for controlling and/or supplying energy to the electric application. In this configuration, the computing devices of numerous drives 1 can exchange data pertaining to the noise signals occurring at said numerous drives 1 and other performance parameters with one or with a few centralized maintenance computers. Hence, a large amount of data can be accessed by the maintenance computers and analysed with respect to the performance of the drives 1. By collecting and analysing such large amounts of performance parameters, the quality of the analysis and of corresponding performance adjustments, maintenance measures and/or improvements can be enhanced.

The microphone 2 can also be used to control the computing device and/or the drive by verbal input of an operator. This feature can be implemented by means of e.g. corresponding software provided on the computing device. In this embodiment, the microphone 2 can complement or substitute input means such as buttons, switches, dials and/or touch screens of the drive 1, thereby reducing the complexity of the drive's 1 hardware and reducing the manufacturing costs of the drive 1 accordingly.

Although FIG. 1 only shows one symbolic external microphone 2, the total number and positioning of microphones 2 may be selected to better use the functionality of the microphone 2. For example, a plurality of internal and/or external microphones 2 may be used for acoustically locating noise sources of registered noise signals by triangulating the positions of the noise source. The plurality of microphones 2 may register a certain noise signal at slightly varying points of time due to the distances between individual microphones 2. The corresponding time differences may then be used by the computing device to establish the distance and the direction of the source of the registered noise signal. These noise signals may occur within the drive 1 and may therefore be indicative of internal malfunctions or other phenomena within the drive 1.

Additionally or alternatively, the registered noise signals may be indicative of external phenomena, which occur outside the drive 1, such as e.g. malfunctions of the electric application driven by the drive 1, or other relevant phenomena near the drive 1. These external phenomena may be indicative of human behaviour such as e.g. the unauthorized presence of a person near the drive. In this case, an unauthorized person's footsteps or voice may be registered by the microphone 2. The microphone 2 and the computing device may furthermore be set up to identify certain kinds of acoustic information uttered by a nearby person or output by nearby devices. This acoustic information may comprise words spoken by a human and/or some automatically generated noise signals for transferring information acoustically between two electronic devices.

The invention is also directed at a maintenance process, in particular a predictive maintenance process, for a drive 1 as previously described. The maintenance process is shown schematically in FIG. 2. The maintenance process may comprise the steps of
   registering noise signals occurring at the drive 1;
   comparing the registered noise signals to previously stored noise signals; and
   outputting output signals as a function of the comparison of the registered noise signals to the previously stored noise signals.

Figure 2:
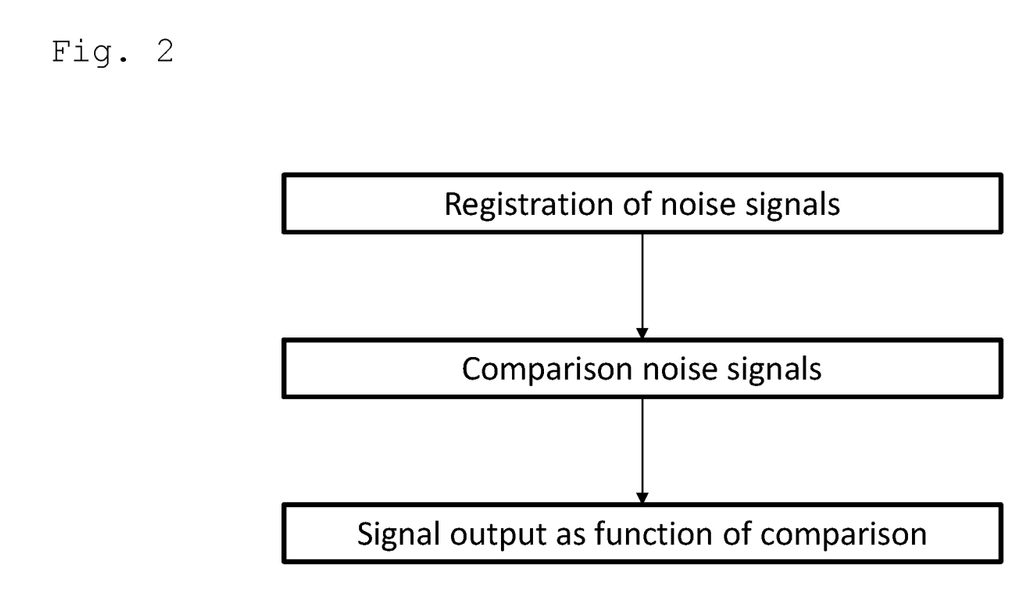
FIG. 2: schematic view of maintenance process

The registering of noise signals may be conducted in the above-described manner and may comprise the location of a noise signal source. Comparing the registered noise signal to previously stored noise signals may be conducted by means of the computing device connected to the microphone 2 and/or by some other computing device such as a maintenance computer. When comparing registered noise signals to previously stored noise signals, it may be established that the former resembles the latter to a certain degree. The maintenance process may therefore establish that a previously stored noise signal is identical or sufficiently similar to the registered noise signal. The registered noise signal may then be attributed to the occurrence of phenomena such as maintenance issues and/or malfunctions or expected malfunctions of the drive 1 and/or of the electric application or vice versa. In order to enable this attribution of registered noise signals to the occurrence of various phenomena, the previously stored noise signals may be attributed to corresponding phenomena such as malfunctions. The attribution of certain phenomena to certain previously stored noise signals may comprise corresponding data provided to or at the computing device of the drivel.

If a malfunction or some other phenomenon has been attributed to a registered noise signal or vice versa, the maintenance process may then output signals, which indicate e.g. what kind of malfunction is expected and/or what kind of maintenance work should be conducted. The output signals may also indicate when said maintenance work should be conducted. The output signal may take any form, be it acoustic, optical, electronic or a mix of the named forms.

Figure 3:
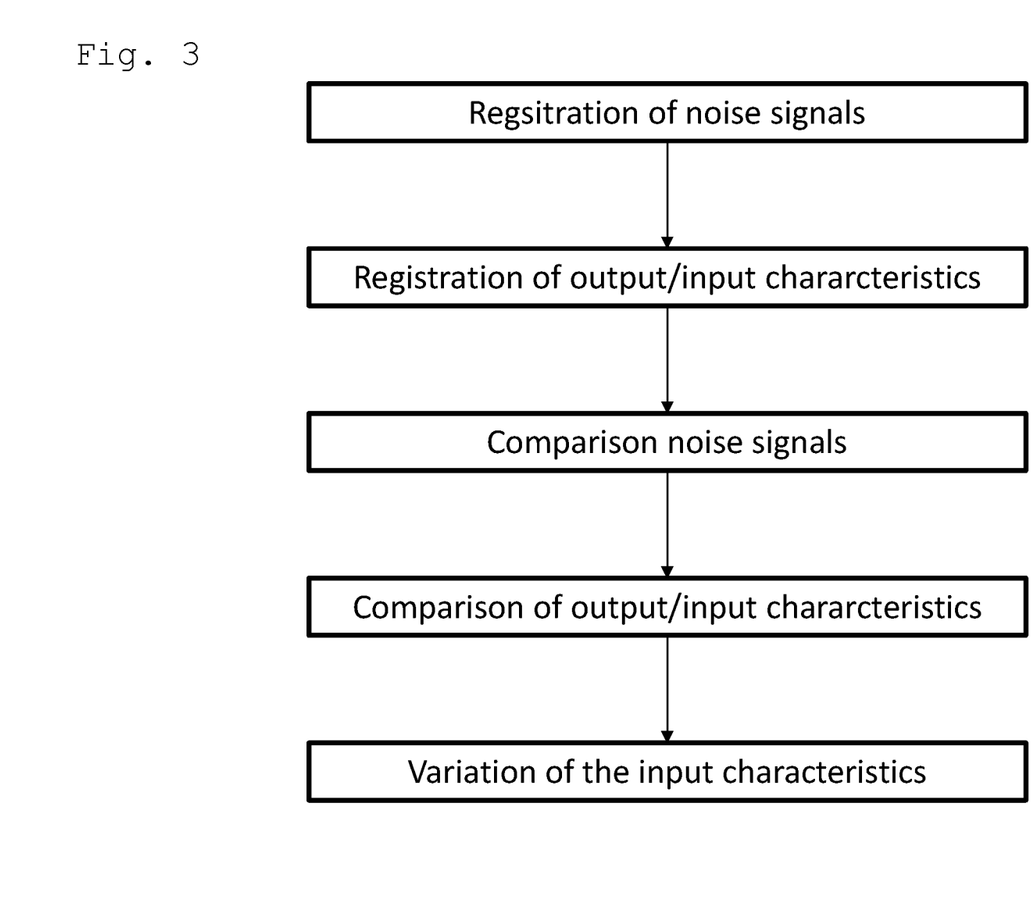
FIG. 3: schematic view of process for fine-tuning a drive control method

The present invention is also directed at a process for fine-tuning a drive control method of a drive 1. This process is shown in FIG. 3 in a schematic view. The process comprises the following steps of
registering noise signals occurring at the drive 1;
registering output and/or input characteristics of the electric application and/or the drive 1;
comparing the registered noise signals to previously stored noise signals;
comparing the registered output and/or input characteristics to previously stored output and/or input characteristics; and
varying the input characteristics, as a function of the comparison of the registered noise signals to the previously stored noise signals and/or as a function of the comparison of the registered output and/or input characteristics to previously stored output and/or input characteristics, such that the noise signals occurring at the drive 1 are minimized and/or that the output characteristics of the electric application and/or the drive 1 are maximized.

The registering of noise signals may be conducted in the above-described manner and may again comprise the location of a noise signal source. For fine-tuning the drive control method of the drive, 1 it may be additionally helpful to register further phenomena, such as various input/output characteristics of the electric application and/or of the drive 1. These characteristics may correspond to acoustic characteristics such as noise levels and/or electrical characteristics such as measured current, voltage, frequency, impedance and/or resistance values of electric signals of the drive 1 and/or of the electric application or of components thereof. These characteristics may be indicative of the performance of the drive 1 and/or of the electric components driven by the drive 1 or of components thereof.

The registered noise signals and the registered input/output characteristics may be compared to previously stored reference values. The process may comprise monitoring trends i.e. changes in the registered noise signals. In this context, currently registered noise signals may be stored. These newly stored noise signals effectively correspond to the previously stored noise signals and may be compared to currently registered noise signals. From the comparisons of various sets of stored noise signals trends indicating longer term changes in the noise signals can be monitored. This can occur over sets of stored and registered noise signals, said sets being chosen or determined so as to preferably indicate relevant changes in the overall performance of the drive 1.

The drive control method employed by the drive 1 for driving an electric application may be modified in dependence on the comparison of the registered noises and input/output characteristics to previously stored reference values. As an example, the input characteristics of the electric application may be varied such that the noise signals generated by the electric application are minimized for some desired output characteristic of the electric application. The noise signal may be a noise signal caused by an electric application such as a motor. Alternatively or additionally, the registered noise signal may be some noise by a filter of the drive 1 or some filter connected to the drive 1.

The present maintenance process and the fine-tuning process may be used during e.g. production testing of a ready-made drive 1. In this context, various noise signals and characteristics presently described can be used for verifying whether a ready-made drive 1 is functioning correctly, prior to its delivery to a customer.

Additionally or alternatively, the present maintenance and fine-tuning processes can be used as a trouble-shooting tool for commissioning engineers, who are identifying malfunction of a given drive 1.

In general, the present invention may be implemented with regard to a variety of different relevant noise signals registered by the microphone 2 and/or previously stored at the computing device. In addition, a variety of other characteristics of the drive 1 and/or of the electric application may be registered and/or stored according to the invention. Furthermore, the registered and/or stored characteristics may pertain to phenomena occurring at devices other than the drive 1 and/or the electric application driven by the drive 1. For example, said characteristics may pertain to phenomena occurring at any structures or devices near the drive 1, as long as the phenomena can be acoustically registered by the microphone 2. A few non-exhaustive examples for relevant noise signals and phenomena will be given in the following paragraphs of the description, all of which may be employed in the context of the present invention.

In case the drive 1 and/or the electric application comprise one or more fans for e.g. cooling said devices, the noises generated by the fan at various speeds may be registered and/or stored. This configuration makes it possible to e.g. determine the speed of the fan through the noise generated by it. It is therefore possible to omit other speed determination hardware and to thereby make the construction of the drive 1 simpler and cheaper. The noise generated by the fan may be indicative of some malfunction of e.g. the fan motor or the mechanical structure of the drive 1. Should the mechanical structure of the drive 1 be weakened by e.g. some loose component, the noise generated by the turning fan and more precisely by the vibrations of the loosened mechanical structure of the drive 1, which are induced by the turning fan, could be registered in the sense of the present invention. One the presence of a corresponding weakened structure or loose component has been determined, this information can be output to a user or to another device in order to e.g. initiate some maintenance process.

In a case in which the drive 1 and/or the electric application comprise a heatsink, the clogging of said heatsink could also result in some characteristic noise signals. These characteristic noise signals could be part of the noise signals previously stored by the drive 1 or rather by the computing device of the drive 1 and could obviously be attributed to the clogging of a heat sink.

In embodiments in which the drive 1 and/or the electric application comprise liquid cooling channels, a characteristic noise signal of a clogged cooling channel might be stored by the computing device. Should such noise signals be registered by the microphone 2, then a corresponding comparison of the registered noise signals to the stored noise signals could indicate the presence of a clogging and the necessity of corresponding maintenance measures. Once a corresponding noise signal has been registered, the drive 1 can output some signals to an operator or to other devices, indicating the need for maintenance works.

In a similar fashion, air in the liquid cooling channels or circuits can be registered. As air in the cooling channels and clogging of the cooling channels may generate distinct acoustic signature noises or characteristic responses to mechanical excitations, these two phenomena may be recognized and distinguished by the present invention. In order to achieve this, once again, the corresponding signature noises may be stored with the computing device and attributed to their corresponding underlying phenomena.

In embodiments of the drive 1 comprising liquid cooling circuits, the occurrence of leakages in the circuits may also result in corresponding acoustic phenomena such as e.g. dripping noises. A variety of signals associated with the occurrence of leakages corresponding to different kinds of leakages and/or degrees of leakages may be stored at the computing device and used for comparison with the registered noise signals. In particular, according to the present invention, the noises generated by leaking sealings can be registered by the microphone 2 and stored in the computing device for comparison.

In another embodiment of the invention, the microphone 2 makes possible the detection of loose contacts of the drive 1 or of devices near the drive 1. For this purpose, corresponding noise signals, which are characteristic of a loose contact, are stored at the computing device. Once similar noise signals are registered by the microphone 2, the drive 1 may identify a loose contact and, depending on the variety of the previously stored noise signals, the actual kind of loose contact.

The drive 1 may comprise a variety of components, which may deteriorate during the lifespan of the drive 1. As the components deteriorate, their performance and comportment may change accordingly, frequently resulting in altering acoustic characteristics of the components. These altered acoustic characteristics may be well known and may be provided in the form of previously stored noise signals at the computing device. In general, all acoustic phenomena known to occur at or near the drive 1 may be stored in the form of their noise signals i.e. a corresponding audio file. These stored noise signals may be provided at the drive 1 prior to and during its use for driving some electric application. Accordingly, registering such noise signals or altered acoustic characteristics by means of the microphone 2 may be linked to the occurrence of aged components of the drive 1, aged components near the drive 1 or any other previously stored audible phenomenon.

Another example of phenomena, which can be linked to noise signals, are bearing problems or bearing defects at a motor, such as an electric motor driven by the drive 1. In this case, the electric motor may be the electric application driven by the drive 1. Bearings are usually used for mounting rotational parts of motors to stationary parts of motor support structures. Bearings may create a variety of noises depending on the states they are in. Broken bearing balls or rollers may be indicated by a rattling noise, overheating bearings or broken bearings may result in yet other characteristic noise signals which can be stored at the drive 1 and later, during operation, registered by the microphone 2. Depending on the actual noise signal registered by the microphone 2, the drive 1 may be set up to indicate the occurrence of some bearing malfunction and/or fine tune the drive control method such that an electric motor driven by the drive 1 is driven in a manner which takes into account the malfunctioning bearing of the motor. As an example, the drive 1 could reduce the maximum permissible speed of the motor when a malfunctioning bearing has been acoustically detected.

Other examples of relevant phenomena generating noise signals comprise more general mechanical vibrations during the use of the drive 1. Such mechanical vibrations may correspond to noise signals which are caused by noise sources registered by the microphone 2 but which cannot be identified at first. The drive 1 according to the invention or the processes according to the invention may deduce that an unknown noise source has been registered, if the registered noise signal does not resemble any previously stored noise signal to a sufficiently high degree.

The mechanical vibrations registered by the invention may correspond to vibrations occurring during the use and/or during some testing procedure of the drive 1, the electric application and/or other devices or structures near the drive 1. The present invention may be used to detect wear or deterioration of corresponding structures before other detection means such as acceleration sensors detect the change of structural behaviour.

The present invention may be used to acoustically detect mechanical but also electronic failures, such as e.g. shoot-throughs. The shoot-throughs may occur at the electric application such as e.g. a motor, at the drive 1 itself and/or at filters associated with the drive 1, the electric application or other devices near the drivel.

Another example of electronic failures, which can be acoustically detected by the invention, is the aging of contactors and/or relays present at the drive 1, at the electric application and/or at any structures or devices near the drivel.

Short circuits are another example of electronic failures, which can be detected according to the invention. In particular, vibration and/or other movements caused by associated magnetic fields may create characteristic noise signals, indicative of short circuits at the drive 1, at the electric application and/or at devices and/or structures near the drive 1. The present invention may be used in conjunction with the detection of electrical resonances or more generally any other audible phenomena occurring within the range of audibility of the microphone 2.

The audibility of the phenomena may obviously refer to the audibility by the microphone 2 used, rather than the audibility to a human listener. Accordingly, the detection of structure-borne noises, which may or may not be audible to a human listener, also falls under the scope of the present invention. Said noises may be created at a motor, the electric grid, DC-bus cables and/or bus bars in the range of audibility of the drive's 1 microphone 2. Examples for such structure-borne noises have been given above and include phenomena outside the drive 1, which are audible to the microphone 2 at the drive 1. In addition, the wear out of a motor connected to the drive 1 can be transmitted by structure-borne noise signals through e.g. a motor cable or other devices connecting the motor structurally to the drive 1. Further examples for structure-borne noises include phenomena on a common DC-bus such as loose contracts, resonances, fuses burnings, phenomena in batteries or the like. By registering structure-borne noise signals transmitted by a common DC-bus, it is possible to easier use the invention with respect to noise sources other than those present at the drive 1 itself. Other structure-borne noise signal which can be exploited by the present invention include noise signals related to phenomena in the supply grid of the drive 1 and which can be related to issues similar to those described above with respect to common DC-buses and comprising loose contacts, resonances, fuse burnings and the like.

Furthermore, the registration of structural-borne noises facilitates the detection of phenomena, which originate in a customer application connected and/or driven by the drive 1, said customer application being separated and distinct from the drive 1 itself.

The invention is not limited to one of the above-described embodiments, but can be modified in many ways.

All of the features and advantages arising from the claims, the description and the drawings, including constructive details, spatial arrangements and procedural steps, can be essential to the invention both individually and in the most varied of combinations.

What is claimed is:

1. A drive for an electric motor, comprising at least one microphone for registering noise signals occurring at the drive, wherein the microphone is integrated on a circuit board of the drive and the microphone is connectable to a computing device for analysing the registered noise signals by comparing the registered noise signals to previously stored noise signals.

2. The drive according to claim 1, wherein the drive comprises a front-end or input rectifier, an inverter drive, a controller, a frequency converter, an inverter, a converter, and a front end drive.

3. The drive according to claim 1, wherein the microphone is an acoustic microphone.

4. The drive according to claim 1, wherein the computing device being connected to the one microphone.

5. The drive according to claim 1, wherein the computing device is connected to a maintenance computer.

6. The drive according to claim 1, wherein the computing device or the drive is controllable by verbal input of an operator into the microphone or that more than one microphone is provided.

7. A maintenance process for the drive according to claim 1, comprising the steps of
registering noise signals occurring at the drive;
comparing the registered noise signals to previously stored noise signals; and
outputting output signals as a function of the comparison of the registered noise signals to the previously stored noise signals.

8. A process for fine-tuning a drive control method of the drive according to claim 1, comprising the steps of
registering noise signals occurring at the drive;
registering output or input characteristics of the electric application or the drive;
comparing the registered noise signals to previously stored noise signals;
comparing the registered output or input characteristics to previously stored output or input characteristics; and
varying the input characteristics, as a function of the comparison of the registered noise signals to the previously stored noise signals or as a function of the comparison of the registered output or input characteristics to previously stored output or input characteristics, such that the noise signals occurring at the drive are minimized or that the output characteristics of the electric application or the drive are maximized.

9. The process according to claim 8, wherein it comprises a sweep of a motor load or a sweep of a motor frequency.

10. The drive according to claim 2, wherein the microphone is an acoustic microphone.

11. The drive according to claim 2, wherein the microphone is integrated on a circuit board of the drive.

12. The drive according to claim 3, wherein the microphone is integrated on a circuit board of the drive.

13. The drive according to claim 2, wherein the computing device being connected to the one microphone.

14. The drive according to claim 3, wherein the computing device being connected to the one microphone.

15. The drive according to claim 2, wherein the computing device is connected to a maintenance computer.

16. The drive according to claim 1, wherein the microphone is a vibroacoustic microphone.

17. The drive according to claim 1, wherein the microphone is a piezo sensor.

18. The drive according to claim 1, wherein the microphone is a wave sensor.

19. The process according to claim 7, wherein the process is a predictive maintenance process.

* * * * *